United States Patent
Jarrar et al.

(10) Patent No.: US 9,088,280 B2
(45) Date of Patent: Jul. 21, 2015

(54) BODY BIAS CONTROL CIRCUIT

(71) Applicants: Anis M. Jarrar, Austin, TX (US);
Stefano Pietri, Lakeway, TX (US);
Steven K. Watkins, Austin, TX (US)

(72) Inventors: Anis M. Jarrar, Austin, TX (US);
Stefano Pietri, Lakeway, TX (US);
Steven K. Watkins, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/067,320

(22) Filed: Oct. 30, 2013

(65) Prior Publication Data

US 2015/0116030 A1    Apr. 30, 2015

(51) Int. Cl.
*G05F 3/08* (2006.01)
*H03K 17/16* (2006.01)

(52) U.S. Cl.
CPC .................. *H03K 17/162* (2013.01)

(58) Field of Classification Search
None
See application file for complete search history.

(56) References Cited

U.S. PATENT DOCUMENTS

| | | | |
|---|---|---|---|
| 5,874,851 A * | 2/1999 | Shiota | 327/537 |
| 6,232,793 B1 * | 5/2001 | Arimoto et al. | 326/34 |
| 6,343,044 B1 | 1/2002 | Hsu et al. | |
| 6,934,187 B2 | 8/2005 | Cheung | |
| 7,042,275 B2 * | 5/2006 | Suwa et al. | 327/536 |
| 7,551,507 B2 * | 6/2009 | Nakai et al. | 365/226 |
| 7,723,970 B1 | 5/2010 | Fernald | |
| 7,741,898 B2 * | 6/2010 | Hsu | 327/536 |
| 8,120,411 B1 | 2/2012 | Liu et al. | |
| 2006/0094231 A1 | 5/2006 | Lane et al. | |
| 2006/0132218 A1 * | 6/2006 | Tschanz et al. | 327/534 |
| 2008/0007321 A1 | 1/2008 | Castaldo et al. | |
| 2012/0049917 A1 | 3/2012 | Cook | |

FOREIGN PATENT DOCUMENTS

CN    102386763 A    3/2012

OTHER PUBLICATIONS

Pangrle, B., "The Good Kind of Bias", www.lp-hp.com/pangrle/2010/10/07/the-good-kind-of-bias/, Oct. 7, 2010.

* cited by examiner

*Primary Examiner* — Lincoln Donovan
*Assistant Examiner* — Terry L Englund (57) ABSTRACT

A body bias control circuit including an output coupled to provide a bias voltage to a body terminal. The body bias control circuit is configured to change the bias voltage from a first bias voltage to a second bias voltage over a period of time in which a magnitude of an effective rate of change of the bias voltage varies over the period of time. For voltages between the first and second bias voltages closer to a source voltage, the magnitude of the effective rate of change is smaller than for bias voltages between the first and second bias voltages further from the source voltage.

20 Claims, 5 Drawing Sheets

BODY BIAS CONTROL CIRCUIT

BACKGROUND OF THE INVENTION

1. Field of the Invention

This invention relates in general to circuits and more specifically to transistor body bias control circuits.

2. Description of the Related Art

Transistors are used to implement circuitry in an integrated circuit. For some transistors, such as some types of Field Effect Transistors, carriers (e.g. holes or electrons) move in a channel region between a source and a drain of the transistor when a voltage above a threshold voltage is applied to the gate of the transistor. Typically, the channel region is located in a doped semiconductor well.

With some transistors, both the switching speed of the transistor and the sub threshold leakage current are determined by the threshold voltage. For FETs, a higher threshold voltage corresponds to a slower switching speed and lower leakage current. A lower threshold voltage corresponds to a faster switching speed but with higher leakage current. The amount of leakage current affects the power consumption of the transistor where a higher leakage current corresponds to higher power consumption.

The threshold voltage of a transistor (and correspondingly the leakage current, power, and switching speed) can be adjusted by biasing the body of the transistor (typically the well were the channel region is located) at a voltage different than the voltage applied to the source of the transistor (source voltage). Reverse body biasing can be used to raise the threshold voltage of a transistor. With an NFET, reverse body biasing is performed by applying a voltage to the body that is less than the voltage applied to the source (typically system ground (VSS) in some examples). For a PFET, reverse body biasing is performed by applying a voltage to the body that is greater than the voltage applied to the source (typically VDD in some examples).

Forward body biasing can be used to lower the threshold voltage of a transistor. For an NFET, forward body biasing is performed by applying a voltage to the body that is higher than the voltage applied to the source. For a PFET, forward body biasing is performed by applying a voltage to the body that is less than the voltage applied to the source.

In some examples, a rise in ambient temperature causes more leakage current during operation. Hence a transistor operating in a hotter environment may generate a greater amount of leakage current than one operating in a cooler environment.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

It has been discovered that providing a body bias control circuit that varies the effective rate of change of the body bias over time during a transition of the body bias, may provide for a system whose voltage regulation can be more desirably controlled during the transition.

As stated above, a transistor's leakage current can be changed by changing the body bias to change the threshold voltage of a transistor. It may be desirable to selectively adjust the leakage current of transistors of a circuit to control power usage or to adjust operating speed. Also, body bias may be changed during a start up or reset period.

With some circuits, a change in the amount of leakage current causes a change in current usage and power consumption of a circuit. If the leakage current changes too quickly, the voltage provided by a voltage regulator powering the circuit may be pulled outside of desired tolerances. For example, a sudden change in the power draw of a circuit may lead to an overshoot or undershoot of a supply voltage from a voltage regulator powering the circuit. Out of tolerance supply voltages may cause operational problems with a circuit (e.g. erroneous data generation, erroneous resetting, and transistor damage). Hence, with some systems, there is a desirability to limit the amount of change in leakage current during a transition of the body bias applied to transistors of a circuit.

However, in addition to the requirement to limit the amount of change in leakage current, systems may also have timing requirements limiting the time to change modes where a change in body bias is required. Such requirements include a time permitted for a change in power modes or for startup. With some systems, a faster startup time or a faster time to change power modes is preferred.

To enable fast start up or mode switching times, it may be desirable for the change in leakage current to be linear at a rate that is just below a rate that would cause a regulator output voltage to be pulled out of tolerance. Changing the leakage current at a slower rate during any part of the transition would increase startup or power mode switching times. A higher rate of change in leakage current at any point in the transition would cause the regulated voltage to be out of tolerance.

However, with some types of transistors, an amount of change in the leakage current due to a change in body bias is not proportional with the amount of change in body bias across a range of body bias voltages. With some transistors, a small change in the body bias at bias voltages near the source voltage can cause a greater amount of change in leakage current. In one example, applying an initial 100 mV change in the body bias from the source voltage provides for an approximately 23% reduction in leakage current. The second 100 mV change in body bias from the source voltage provides for an approximately 12% reduction in leakage current. The third 100 mV change in bias body bias from the source voltage provides for an approximately 9% reduction in leakage current. The last 100 mV change in body bias from the source voltage provides for only a 5% reduction in leakage current. Thus, while changing the body bias from the source voltage to a voltage value that is 400 mV from the source voltage causes an approximate 49% reduction in leakage current, almost half of that reduction occurs in the first 100 mV of change. These specific results were provided for a fast corner NFET from typical 90 nm technology, 55 nm technology or beyond, operating in an environment of 165 C, where the body bias was reduced from 0 volts to −400 mV.

In one example, the dependence of leakage current ($I_{subthreshold}$) to threshold voltage ($V_{th}$) is set forth as follows (where $V_{gs}$ is the gate to source voltage, $V_T$ is the temperature voltage (see enclosed image below), and $V_{ds}$ is the drain to source voltage, n is the sub-threshold correction parameter:

$$I_{subthreshold} = I_0 e^{\frac{V_{gs}-V_{th}}{nV_T}} \left[1 - e^{-\frac{V_{ds}}{V_T}}\right]$$

where $V_T$ is the temperature voltage derived from $V_T=(k*T)/q$ with k being the Boltzmann constant, T the absolute temperature, and q the electron charge.

Accordingly, controlling the change in body bias such that smaller changes over time occur at voltages closer to the source voltage may reduce the change in leakage current during these transition periods such that the power supply voltage will not be pulled at of tolerance.

Furthermore as shown above, the further the body bias is changed from the source voltage, the effect of a change in body bias on threshold voltage and leakage current (and therefore power consumption) is less. Thus, larger changes in body bias voltages can be tolerated at these voltages. Accordingly, at these voltages, the body bias can be changed more quickly to reduce the transition time without causing the supply voltage to be out of tolerance.

Accordingly, in some embodiments described herein, the body bias control circuit changes the body bias voltage in a manner such that the change in leakage current will not cause the power supply voltage to be operating out of tolerance during the transition and yet reduces the time needed for the transition. In one embodiment, the body bias control circuit changes the body bias such that the leakage current changes at a linear at a rate during the transmission where the linear rate is below a rate that would cause the power supply voltage to become out of tolerance. In some embodiments, the rate of change of the body bias during a transition would be dependent on the operating temperature or designed for the intended operating temperature.

In some embodiments, the body bias control circuit changes the body bias voltage from the source voltage to the desired body bias in a quadratic manner over time with smaller changes in body bias over time occurring at voltages closer to the source voltage and larger changes in body bias over time occurring at farther voltages from the source voltage. In some embodiments, this quadratic manner provides for a linear change in leakage current during the transition. The phrase "changing in a quadratic manner" does not necessarily require that the body bias voltage follows an exact quadratic curve during every moment in the transition, but instead means that the moving average of the body bias moves in a manner that is generally characterized as being quadratic, although it does not necessarily require that it be exactly quadratic. For embodiments that include a number of intermediate target levels of body bias, the moving average is calculated over multiple target level transition periods.

Figure 1:
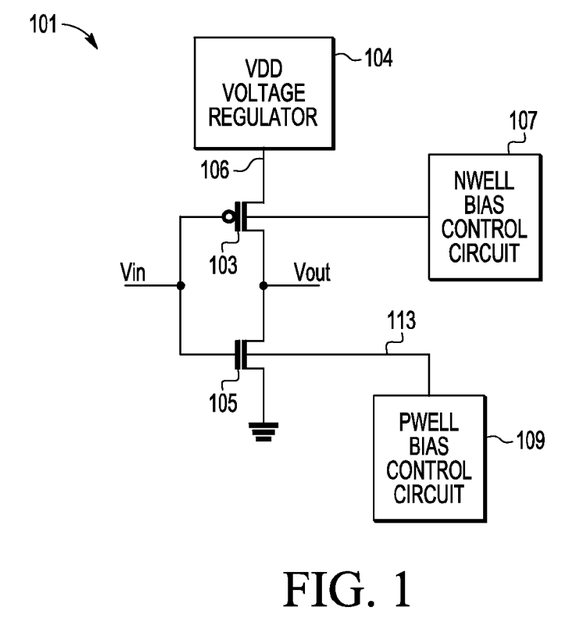
FIG. 1 is a block diagram of a circuit according to one embodiment of the present invention.

FIG. 1 is a portion of a circuit according to one embodiment of the present invention. In the embodiment shown, circuit 101 includes an inverter including an NFET 105 and a PFET 103. The gate terminals of the NFET 105 and PFET 103 are connected together at node Vin. The drain terminals of NFET 105 and PFET 103 are connected together at node Vout. The source terminal of PFET 103 is connected to voltage regulator output terminal 106 of voltage regulator 104 that provides a power supply voltage VDD. The source terminal of NFET 105 is connected to a system ground terminal.

In the embodiment shown, the body terminal of PFET 103 is connected to an Nwell bias voltage control circuit 107. The body terminal of NFET 105 is connected to a Pwell bias control circuit 109 via node 113. Circuit 107 controls the body bias of PFET 103 and circuit 109 controls the body bias of NFET 105.

In one embodiment, control circuit 109 controls the body bias of transistor 105 such that the body bias transitions from a first bias voltage (e.g. the source voltage) to a second bias voltage over a period of time in which an effective rate of change of the body bias varies over the period. During the transition, for body bias voltages between the first bias voltage and second bias voltage closer to the source voltage, the effective rate of change of the body bias is smaller in magnitude than for body bias voltages further from the source voltage. For example, during a transition to a low power mode when it is desirable to reduce power consumption, control circuit 109 will perform reverse body biasing to reduce the bias voltage from ground to a negative voltage (e.g. −400 mV) to raise the voltage threshold of NFET 105 to reduce leakage current. During the transition, the effective rate of change of the body bias is lower in magnitude at voltages closer to ground than at voltages closer to −400 mV.

In one embodiment, control circuit 107 controls the body bias of PFET 103 to reverse bias PFET 103 at voltages greater than VDD during at least some low power modes. In some embodiments during a transition, the magnitude of the effective rate of change of the body bias by circuit 107 also increases as the body bias goes higher than VDD. However, in other embodiments, control circuit 107 is a connector that ties the body of PFET 103 to the VDD terminal.

In some embodiments, control circuits 109 and 107 may also be used to forward bias transistors NFET 105 and PFET 103, respectively. In one embodiment, control circuits 109 and 107 control the body bias voltage during the transition to the forward bias voltages by changing the body bias voltages more slowly at body bias voltages closer to the source voltage (e.g. VDD, ground) than when the body bias voltages are farther away from the source voltage.

Although FIG. 1 shows that circuit 101 has an inverter, circuit 101 may include other types of circuitry including circuitry with multiple transistors arranged in various circuit configurations. In some embodiments, the other circuitry includes NFETs whose body terminals are connected to control circuit 109 and PFETs whose body terminals are connected to control circuit 107.

Figure 2:
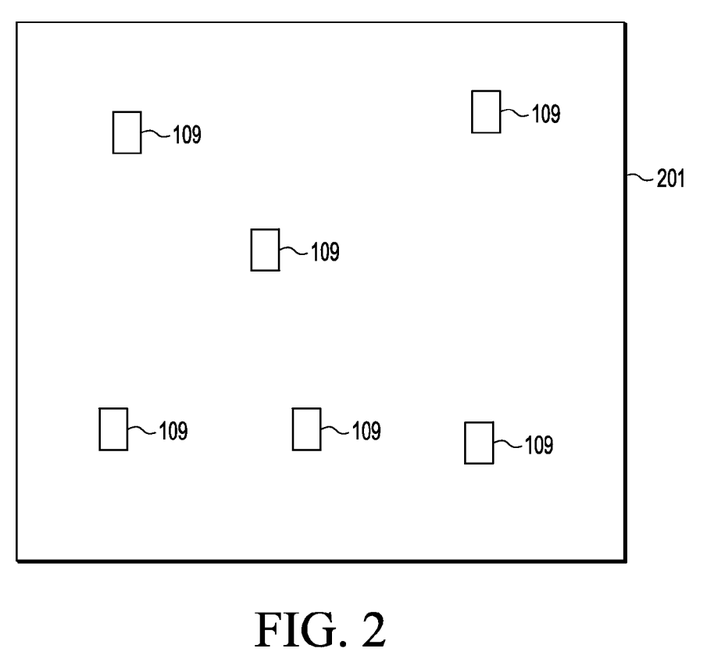
FIG. 2 is a block diagram of a circuit according to one embodiment of the present invention.

FIG. 2 is a block diagram of an integrated circuit 201 that includes a number of Pwell bias control circuits 109 for controlling the bias voltages of multiple NFETs (not shown) of integrated circuit 201. In one embodiment, integrated circuit 201 includes multiple independent Pwells with each Pwell including multiple NFETs. The NFETs may be configured to implement a number of different types of circuits. Each independent Pwell has an associated bias control circuit 109 connected to provide a bias voltage to the Pwell to control the body bias of the NFET transistors of the independent Pwell. Accordingly, the body bias of the NFETs of a Pwell can be independently controlled from the body bias of the NFETs of the other Pwells. With such a configuration, different portions of the integrated circuit 201 can be placed in different power modes at different times. In other embodiments, each Pwell would be connected to multiple body bias control circuits 109. Not shown in FIG. 2 are the Nwell bias control circuits 107 or other circuitry of integrated circuit 201.

Figure 3:
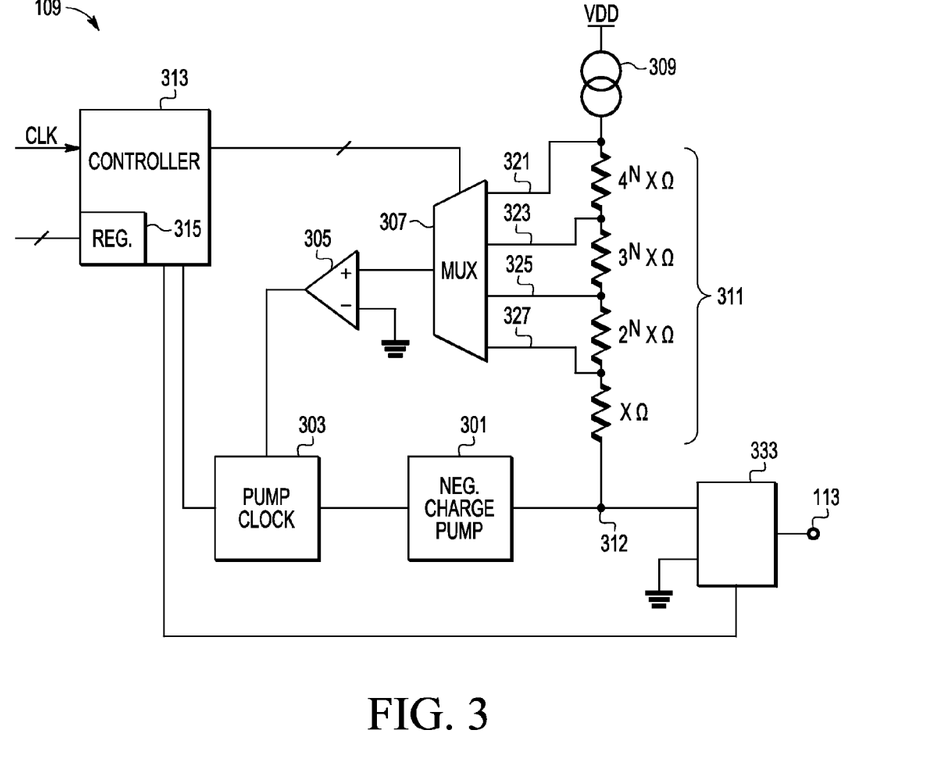
FIG. 3 is a circuit diagram of a body bias control circuit according to one embodiment of the present invention.

FIG. 3 is a circuit diagram of one embodiment of a Pwell bias control circuit 109. Circuit 109 includes a negative charge pump 301, a pump clock 303, a comparator 305, multiplexer (mux) 307, resistor ladder 311, current source 309, controller 313, and power switch 333. Controller 313 includes a register 315 for programming parameters of the control circuit's operation. Negative charge pump 301 provides charge to pull node 312 below system ground during a transition or during a low power mode. During a transition (e.g. from a normal to low power mode) or during a low power mode, switch 333 couples node 312 to node 113. In one embodiment, charge pump 301 is an alternate phase type of charge pump capable of providing a negative voltage (e.g. −1 volts), but may be of another type of charge pump in other embodiments. Pump clock 303 provides a clock signal which causes pump 301 to pull charge from node 312. When clock 303 does not provide a clock signal, pump 301 does not pull charge from node 312.

When the voltage of the non inverting input of comparator 305 is greater than the voltage of the inverting input (which is tied to ground), comparator 305 asserts a high signal to pump clock 303 which causes pump clock 303 to provide a clock signal to charge pump 301. In response to the clock signal, negative charge pump 301 becomes operational to pull node 312 towards a negative voltage. Pulling node 312 to a negative voltage pulls lower the voltages of the tap nodes (321, 323, 325, and 327) of resister ladder 311. These nodes are connected to the inputs of mux 307. Mux 307 is used to select one of the tap nodes (referred to as the selected node) to couple to the non inverting input of comparator 305. When the selected node of ladder 311 reaches ground, comparator 305 pulls its output low, which causes clock 303 to cease providing the clock signal to charge pump 301. At this point, node 312 is at the target voltage (a negative voltage) and pump 301 stops pulling charge from node 113. As the voltage of node 312 drifts higher above the target voltage, pump 301 turns back on when the voltage of the selected node of resistive ladder 311 goes above ground. At which time, comparator 305 turns on pump clock 303 wherein charge pump 301 starts pulling charge from node 312 to lower the voltage of node 312 to the target voltage. Once it reaches the target voltage, comparator 305 stops negative charge pump 301 from pulling charge.

The resistive values between the tap nodes (321, 323, 325, and 327) are set to provide (based on the current of current source 309) different target voltages when coupled to the non inverting input of comparator 305. In the embodiment shown, the individual resistive values are each of a different value. In the embodiment shown, having different resistive values provides for target voltages that are separated by different increments. In one embodiment, current source 309 is designed to provide 0.5 micro amps of current, but may provide other current values in other embodiments.

In the embodiment shown, the resistive values between each set of tap nodes increase quadratically from the restive value between the preceding lower set of nodes. For example, the resistive value between node 327 and node 312 is X ohms and the resistive value between nodes 327 and 325 is $2^N*X$ where N is 0.5. Accordingly, the target voltages associated with each node decrease in a quadratic manner from bottom node 327 to top node 321. The resistive value of X depends upon the amperage of current source 309 and the desired target voltages.

During a normal power mode, circuit 109 provides a ground voltage at node 113. During a normal power mode, power switch 333 couples node 113 to the input of switch 333 that is coupled to ground. In the embodiment shown, switch 333 is controlled by controller 313, but may be controlled by other circuitry in other embodiments. During a normal power mode, controller 313 turns off negative charge pump 301 by disabling pump clock 303 from providing the clock signal. During a low power mode or transition, controller 313 controls switch 333 to couple node 113 to node 312. Also, during a low power mode or transition, controller 313 does not disable pump clock 303 so that pump clock is controlled by comparator 305.

To control the rate of change of the body bias at node 113 during a transition, controller 313 selects a different mux input at each interval (as based on a clock signal) to set a different negative target voltage to which charge pump 301 pulls the voltage of node 113. In the embodiment shown, at an initial period of a transition, switch 333 is changed to couple node 312 to node 113 and tap node 327 is selected. In response, charge pump 301 is activated until the voltage of node 113 matches the first negative voltage level (e.g. −10 mV).

At a second period of the transition, tap node 325 is selected. Because there is a greater amount of resistance between node 325 and node 312 than between node 327 and node 312, charge pump 301 will pull node 312 (and node 113) lower because node 325 is at a higher voltage than node 327 (and therefore requires a lower voltage at node 312 for node 325 to reach ground). With each successive period, a higher tap node of ladder 311 is selected. With each higher tap node, charge pump 301 pulls node 312 (and node 113) to a lower negative voltage until the selected tap node matches system ground. In the embodiment shown, node 321 is associated with the lowest target voltage.

In some embodiments, controller 313 includes a counter (not shown) whose output is coupled to mux 307 to control which input is selected. Where the counter is an up counter, node 327 corresponds to the lowest counter position.

Controller 313 includes a register for programming controller 313. In the embodiment shown, controller 313 can be programmed (e.g. by a processor during operation or by other circuitry during manufacture) to stop at a particular target voltage as the final body bias voltage of the transition. In one embodiment, the counter of controller 313 that controls which input of mux 307 is selected stops counting when the count of the counter matches the programmed value in register 315. Also in some embodiments, the rate at which controller 313 changes taps can be changed as well. If a circuit is operating in a high temperature environment, the controller can be programmed to increase the time between voltage transitions. In other embodiments, the mux could have multiple inputs connected to the resistor ladder that could be selectively used when a slower change in body bias is desired. When a faster change in body bias is desired, some of the intermediate mux inputs would not be used. In one embodiment, circuit 109 is placed in a normal power mode to provide a ground voltage at node 113 by programming register 315 with a particular value (e.g. "00"). However, in other embodiments, controller 313 may receive other signals for switching the power mode of circuit 109.

In one embodiment, the counter counts both in the up and down direction. When it's desired to go back to the higher body bias voltage to increase transistor speed, the counter would down count from selecting tap node 321 to selecting tap node 327. However, controller 313 may be configured differently in other embodiments.

Figure 4:
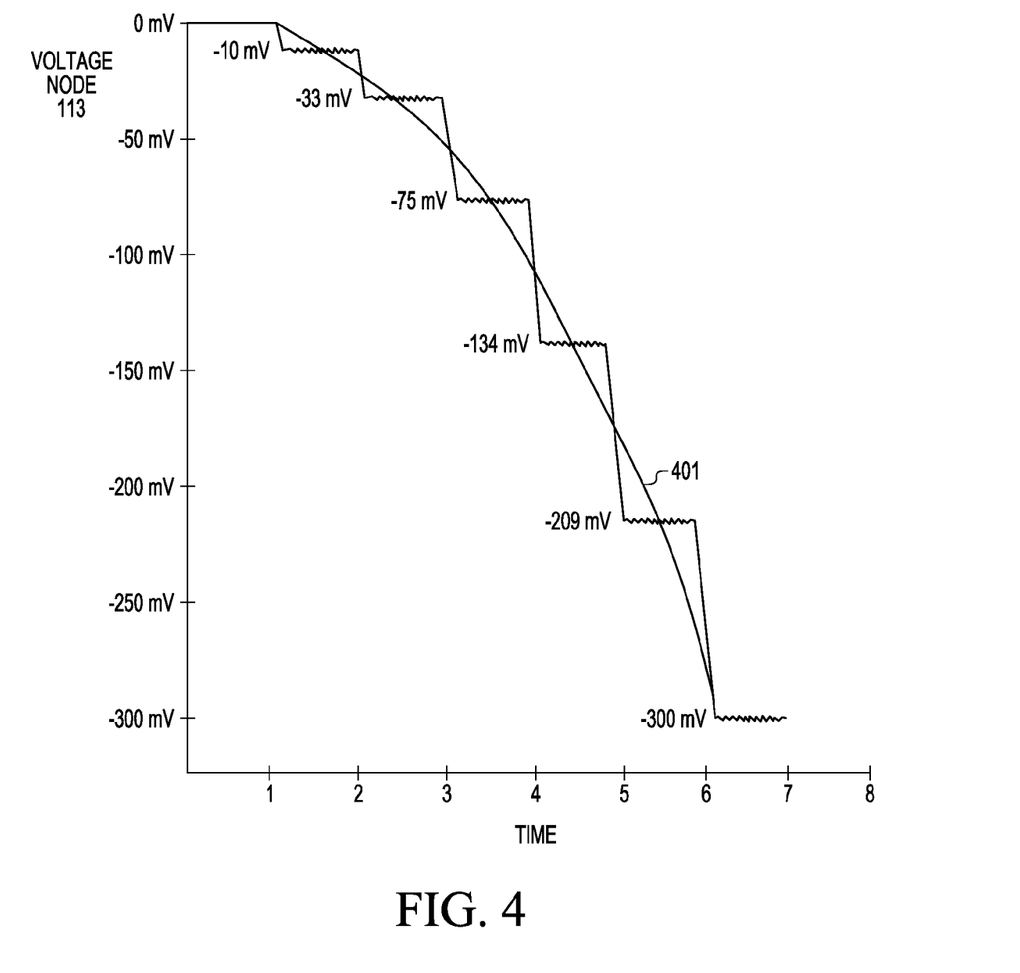
FIG. 4 is a graph showing a change in body bias according to one embodiment of the present invention.

FIG. 4 shows a graph of the voltage of node 113 during a transition from providing a body bias of ground to a body bias of −300 mV as per the operation of the body bias control circuit 109 of FIG. 3.

In FIG. 4, the body bias is initially at 0 Volts which may represent the body bias during a normal operating mode or the body bias initially at startup. This voltage corresponds to node 113 being tied to ground by switch 333. At the first time period (1), controller 313 enables pump clock 303, controls switch 333 to couple node 113 to node 312, and selects tap node 327 which corresponds to target voltage −10 mV. Because the initial voltage was 0V, enabling pump clock 303 and selecting tap node 327 causes charge pump 301 to turn on (as determined by the output of comparator 305) and pull the voltage of node 113 to −10 mV. Once node 113 reaches −10 mV, charge pump 301 turns off. As shown in FIG. 4, between time 1 and time 2, the voltage of node 113 ripples around the target voltage of −10 mV. At this time, when the voltage goes above −10 mV, charge pump 301 is turned on to pull node 113 below −10 mV where charge pump 301 is turned off.

At time 2, controller 313 changes the tap selected by mux 307 to tap node 325 which corresponds to a target of −75 mV. At which time pump 301 turns on to pull the voltage of node 113 to −75 mV. Subsequently, pump 301 is turned on and off to keep the voltage of node 113 at −75 mV. In subsequent cycles, different taps of ladder 311 are selected to pull the voltage of node 113 to even lower target levels (−134 mV, −209 mV) until the voltage is pulled to −300 mV at time 6. As noted in FIG. 4, there are 6 target voltage levels which would correspond to mux 307 having 6 taps. However, for simplicity, only four taps are shown in FIG. 3. In other embodiments, circuit 109 may have additional taps that would allow the voltage of node 113 to be pulled even lower (e.g. −400 mV). In one embodiment, the time intervals are about 5 μs, but may be of other intervals in other embodiments.

Line 401 represents a moving average of the body bias during the transition from 0 V to −300 mV. Note that the magnitude of effective rate of change (the rate of change of the moving average) is lower (a flatter tangent line) at body bias values closer to the source voltage (ground) than at voltage values farther from the source voltage (e.g. at −209 mV, −300 mV). For example, the body bias voltage decreases faster as the bias voltage moves away from the source voltage. Line 401 shows that the magnitude of the effective rate of change of the body bias continuously increases during the transition away from the source voltage. In one embodiment, line 401 is characterized as generally a quadratic function.

Providing a body bias control circuit that provides a lower magnitude of an effective rate of change of the body bias at voltages closer to the source voltage provides for a circuit that does not generate a change in leakage current that would cause the supply voltage (VDD) to be out of tolerance. Providing a body bias control circuit that has a higher magnitude of an effective rate of the change of body bias at voltages further from the source voltage allows for the change in body bias to occur at a faster rate.

In other embodiments, control circuit 109 may having a different number of intermediate levels, have different target voltage values of those levels, and/or change to different final voltage values. In some embodiments, the magnitude of the rate of change of the body bias may be increasing as the voltage moves away from the source voltage, but the movement of the moving average of the body bias is not characterized as being in a quadratic manner.

FIG. 4 shows the progression of node 113 during a transition that decreases the body bias from 0 volts to −300 mV to reverse bias an NFET transistor to decrease the leakage current. If the body bias is at −300 mV and it is desired that the circuit be in a mode where the transistors switch faster, circuit 109 can increase the body bias incrementally such that the leakage current will not change at a rate that will cause the supply voltage to go out of tolerance.

In one embodiment, circuit 109 increases the body bias by sequentially selecting the tap nodes in the opposite order from the reverse biasing order. If the top node 321 is selected for steady state reverse biasing, controller 313 sequentially selects the nodes in reverse order (323, 325, and then 327) to increase the voltage to 0 Volts from −300 mV. To reach 0 volts, controller 313 controls switch 333 to couple node 113 to ground. Controller 313 also disables pump clock 303 at this time.

At first, the voltage increases relatively quickly (from −300 mV to −134 mV in two periods). However, as the body bias approaches the source voltage (e.g. ground), the increase in body bias slows down so that the change in leakage current due to the changing body bias is maintained below a threshold that would cause supply voltage issues. Referring to FIG. 4, a curve of the moving average of the increase in voltage to ground would be a mirror image of line 401 about a vertical axis at time 6.

Figure 5:
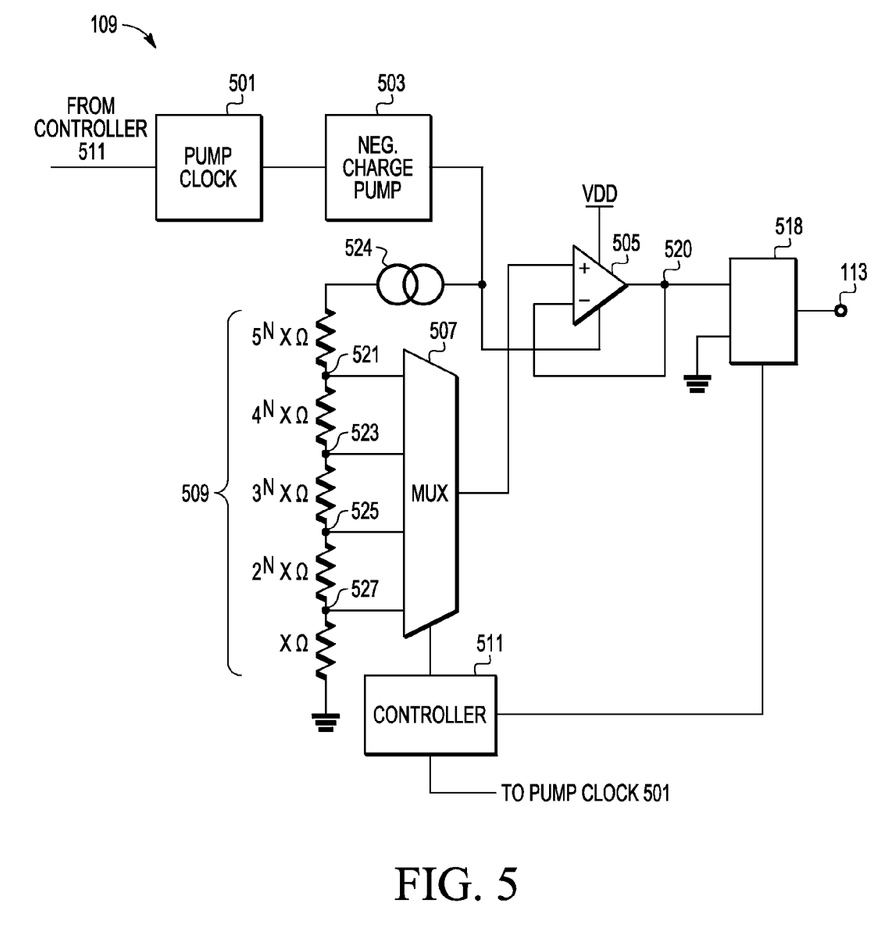
FIG. 5 is a circuit diagram of a body bias control circuit according to another embodiment of the present invention.

FIG. 5 shows another embodiment of a body bias control circuit 109. Control circuit 109 of FIG. 5 includes a pump clock 501, negative charge pump 503, op amp 505, resister ladder 509, multiplexer 507, controller 511, current source 524, and power switch 518. During a low power mode or a transition, pump clock 501 continuously provides a clock signal to negative charge pump 503 which causes negative charge pump 503 to provide a voltage at a minimum value (e.g. −1 V). The output of negative charge pump 503 is provided to current source 524 and to the negative supply rail of op amp 505. The resistance values of the elements of resistive ladder 509 decrease in a quadratic manner from 5N*X to X ohms where N is about 2. Multiplexer 507 includes a number of inputs that are each coupled to a tap node of resister ladder 509. The output of mux 507 is connected to the non inverting input of amplifier 505. Unlike the embodiment of FIG. 3, the voltages of nodes 521, 523, 525 and 527 do not change voltage values due to negative charge pump 503 continuously running during a low power mode or transition. Op amp 505 is configured in a unity gain configuration with the output of op amp 505 (node 520) connected to the inverting input of op amp 505. Power switch 518 is controlled by controller 511 to couple node 113 to node 520 or to couple node 113 to ground. In other embodiments, switch 518 is implemented using the output driver of op amp 505.

During a normal power mode, switch 518 provides a ground voltage to node 113. Also during a normal power mode, controller 511 disables pump clock 501 such that negative charge pump 503 is off. During a low power mode or transition, controller 511 controls switch 518 to couple node 520 to node 113. During this time, controller 511 determines the output voltage of node 113 by selecting the appropriate tap node of ladder 509 that is at that the target voltage. The op amp 505 being configured in the unity gain configuration provides the voltage of the selected tap node at its output node 520. Accordingly, to transition the body bias from a first value to a second value, the controller sequentially selects the nodes of ladder 509 that are at values between the first voltage value and the second voltage value at regular intervals during the transition. Because, during a low power mode or transition, circuit 109 of FIG. 5 is implemented with a continuously running charge pump where the voltage values of the resistor ladder nodes are held constant, the output node 113 voltage appears more "smooth" or steady at the target levels than the output node 113 voltage of the circuit of FIG. 3. In other embodiments, one of the taps of mux 507 may be connected to ground where controller 511 would select that tap during a normal power mode. Such an embodiment may not use switch 518.

In other embodiments, the intervals at which the back bias is changed may occur at non periodic intervals during the transition. For example, in one embodiment, for body bias voltages near the source voltage, the voltage of node 113 would change voltage target levels more slowly. As the voltage moves away from the source voltage, the body bias would change voltage target levels more quickly. In one such example, the amount that the body bias changes during a transition step would be the same for each transition. However, each change in body bias would occur at a decreasing time interval as compared to the previous change in body bias. In one embodiment, the time interval would decrease in a quadratic manner. With such an embodiment, the magnitude of the effective rate of change of the bias voltage would increase over time.

Figure 6:
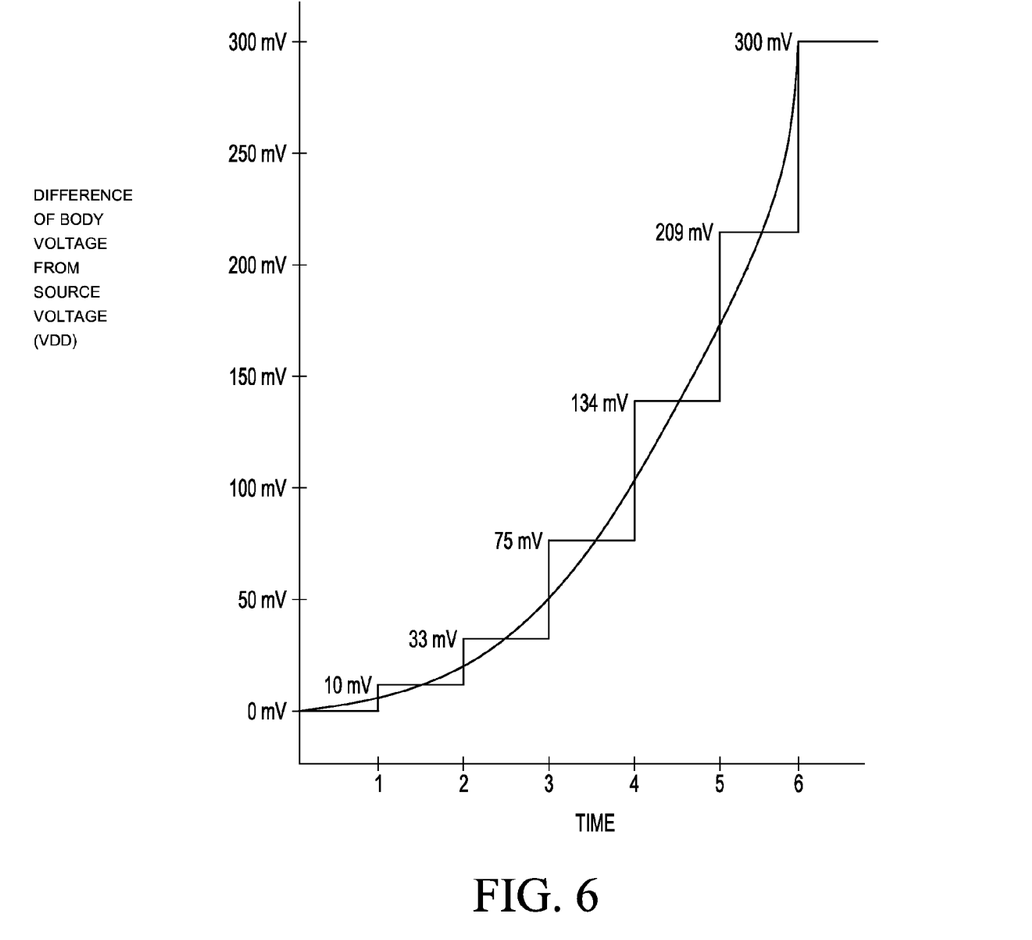
FIG. 6 is a graph showing a change in body bias according to another embodiment of the present invention.

FIG. 6 shows a graph of the voltage of an output of an Nwell bias control circuit 107 during a transition from providing a body bias of VDD to a body bias of 300 mV above VDD for a reverse biasing of a PFET (e.g. PFET 103). The different target voltages for the body bias are of the same magnitude as that of FIG. 4 for the reverse biasing of an NFET. As with FIG. 4, the magnitude of the effective rate of change of the body bias is increasing as the body bias moves away from the source voltage (e.g. VDD) towards 300 mV above VDD.

In one example, an Nwell bias control circuit for controlling the body bias of a PFET may be similar to the Pwell bias control circuits in FIGS. 3 and 5, except that the Nwell bias control circuits include a positive charge pump instead of a negative charge pump. However, in other embodiments, other configurations of an Nwell bias control circuit may be used.

To transition from a mode where the PFET is in a reverse biased condition to a mode where the body bias of the PFET is at VDD, the body bias is reduced in the opposite direction as shown in FIG. 6 where the body bias goes from 300 mV above VDD to VDD in the 6 intervals shown in FIG. 6. Thus, as the body bias gets closer to VDD, the rate of change of the body bias decreases.

Although FIG. 4 shows a graph for reverse biasing an NFET and FIG. 6 shows a graph for reverse biasing a PFET, a PFET can be forward biased as per the graph of FIG. 4 and an NFET can be forward biased as per the graph of FIG. 6. With the case of forward biasing a PFET according to FIG. 4, the Y axis would represent the voltage below the source voltage (e.g. VDD). In the case of forward biasing an NFET according to FIG. 6, the Y axis would represent the voltage above the source voltage (e.g. ground).

The embodiments of FIGS. 3 and 5 implement a control circuit that change the body bias by stepping through a series of target level increments. In other embodiments, the body bias may be changed by ramping the body bias voltage at different rates during the transition.

As set forth above, body bias control circuits can be implemented that provide an increasing magnitude of the effective rate of change of the body bias during a transition of the body bias away from the source voltage. In some embodiments, the moving average of the body bias may change in a quadratic manner. In some embodiments, this change may provide for a change in leakage current that is linear at a rate that is just less than what would produce an out of tolerance power supply voltage.

Providing a body bias control circuit with an increasing magnitude of the effective rate of change of the body bias during a transition may provide for a circuit where the leakage current does not change so rapidly that the supply voltages go out of tolerance. Furthermore, increasing the magnitude of the effective rate of change in the body bias as the voltage moves away from the source voltage enables the transition to occur more quickly.

In one embodiment, a circuit includes a transistor including a body terminal coupled to receive a bias voltage, and a source terminal coupled to receive a source voltage. The circuit includes a body bias control circuit including an output coupled to provide the bias voltage to the body terminal. The body bias control circuit is configured to change the bias voltage from a first bias voltage to a second bias voltage over a period of time in which a magnitude of an effective rate of change of the bias voltage varies over the period of time. For voltages between the first and second bias voltages closer to the source voltage, the magnitude of the effective rate of change is smaller than for bias voltages between the first and second bias voltages further from the source voltage.

In another embodiment, a method for controlling a body bias voltage includes providing a bias voltage to a body terminal of a transistor and a source voltage to a source terminal of the transistor. The method includes changing the bias voltage from a first bias voltage to a second bias voltage over a period of time in which a magnitude of an effective rate of change of the bias voltage varies over the period of time. For voltages between the first and second bias voltages closer to the source voltage, the magnitude of the effective rate of change is smaller than for bias voltages between the first and second bias voltages further from the source voltage.

In another embodiment, a circuit includes a transistor including a body terminal coupled to receive a bias voltage and a source terminal coupled to receive a source voltage. The circuit includes a body bias control circuit including an output coupled to provide the bias voltage to the body terminal, wherein the body bias control circuit is configured to sequentially step at different target levels, the bias voltage from a starting bias voltage to an ending bias voltage over a period of time in which voltage step sizes between the different target levels vary over the period of time. A voltage step size between target levels closer to the source voltage is smaller than a voltage step size between target levels further from the source voltage.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A circuit, comprising:
   a transistor including a body terminal coupled to receive a bias voltage, and a source terminal coupled to receive a source voltage; and
   a body bias control circuit including an output coupled to provide the bias voltage to the body terminal, wherein the body bias control circuit is configured to change the bias voltage from a first bias voltage to a second bias voltage over a period of time in which a magnitude of an effective rate of change of the bias voltage varies over the period of time wherein for bias voltages between the first and second bias voltages closer to the source voltage, the magnitude of the effective rate of change is smaller than for bias voltages between the first and second bias voltages further from the source voltage.

2. The circuit of claim 1, wherein the magnitude of the effective rate of change of the bias voltage increases over the period of time.

3. The circuit of claim 1, wherein a moving average of the bias voltage changes in a quadratic manner over the period of time.

4. The circuit of claim 1, wherein the transistor is an n-type transistor formed in a Pwell, and the second bias voltage is less than the first bias voltage.

5. The circuit of claim 1, wherein the transistor is a p-type transistor formed in an Nwell, and the second bias voltage is greater than the first bias voltage.

6. The circuit of claim 1, wherein the body bias control circuit is configured to change the bias voltage from the first bias voltage to the second bias voltage by applying at the output, each for a corresponding time duration, a series of bias target level voltages in between the first bias voltage and the second bias voltage.

7. The circuit of claim 6, wherein each corresponding time duration is a same time duration.

8. The circuit of claim 6, wherein the body bias control circuit comprises a charge pump used for pulling the output towards each of the series of bias target level voltages and the second bias voltage.

9. The circuit of claim 6, wherein the body bias control circuit comprises:
   a plurality of taps, each tap of the plurality corresponding to a bias target level voltage of the series of bias target level voltages, and
   a tap controller configured to select taps of the plurality of taps, for changing the bias voltage from the first bias voltage to the second bias voltage.

10. The circuit of claim 1 wherein the body bias control circuit is configured to change the bias voltage from the second bias voltage to the first bias voltage over a second period of time in which a magnitude of a second effective rate of change of the bias voltage varies over the second period of time wherein for the bias voltages between the second and first bias voltages closer to the source voltage, the magnitude of the second effective rate of change is smaller than for the bias voltages between the second and first bias voltages further from the source voltage.

11. A method for controlling a body bias voltage, comprising:
   providing a bias voltage to a body terminal of a transistor and a source voltage to a source terminal of the transistor;
   changing the bias voltage from a first bias voltage to a second bias voltage over a period of time in which a magnitude of an effective rate of change of the bias voltage varies over the period of time, wherein for bias voltages between the first and second bias voltages closer to the source voltage, the magnitude of the effective rate of change is smaller than for bias voltages between the first and second bias voltages further from the source voltage.

12. The method of claim 11, wherein the changing the bias voltage from the first bias voltage to the second bias voltage is performed such that the magnitude of the effective rate of change of the bias voltage increases over the period of time.

13. The method of claim 11, wherein the changing the bias voltage from the first bias voltage to the second bias voltage is performed such that a moving average of the bias voltage changes in a quadratic manner over the period of time.

14. The method of claim 11, wherein the transistor is an n-type transistor formed in a P well, and the second bias voltage is less than the first bias voltage.

15. The method of claim 11, wherein the transistor is a p-type transistor formed in an Nwell, and the second bias voltage is greater than the first bias voltage.

16. The method of claim 11 further comprising:
   changing the bias voltage from the second bias voltage to the first bias voltage over a second period of time in which a magnitude of a second effective rate of change of the bias voltage varies over the second period of time, wherein for the bias voltages between the second and first bias voltages closer to the source voltage, the magnitude of the second effective rate of change is smaller than for the bias voltages between the second and first bias voltages further from the source voltage.

17. A circuit, comprising:
   a transistor including a body terminal coupled to receive a bias voltage, and a source terminal coupled to receive a source voltage; and
   a body bias control circuit including an output coupled to provide the bias voltage to the body terminal, wherein the body bias control circuit is configured to sequentially step at different target levels, the bias voltage from a starting bias voltage to an ending bias voltage over a period of time in which voltage step sizes between the different target levels vary over the period of time, wherein a voltage step size between target levels closer to the source voltage is smaller than a voltage step size between target levels further from the source voltage.

18. The circuit of claim 17, wherein a size of each voltage step between the target levels increases over the period of time.

19. The circuit of claim 17, wherein a size of each voltage step between the target levels varies in a quadratic manner over the period of time.

20. The circuit of claim 17, wherein the body bias control circuit comprises:
   a charge pump;
   a plurality of taps coupled to the charge pump, each tap of the plurality of taps corresponding to a target level of the different target levels of the bias voltage; and
   a tap controller configured to select a tap of the plurality of taps corresponding to a target level of the different target levels.

* * * * *